United States Patent [19]

Hayashi

[11] 3,758,875

[45] Sept. 11, 1973

[54] DOUBLE HETEROSTRUCTURE JUNCTION LASERS

[75] Inventor: Izuo Hayashi, Berkeley Heights, N.J.

[73] Assignee: Bell Telephone Laboratories, Incorporated, Murray Hill, Berkeley Heights, N.J.

[22] Filed: May 1, 1970

[21] Appl. No.: 33,705

Related U.S. Application Data

[63] Continuation-in-part of Ser. No. 787,459, Dec. 27, 1968, abandoned, which is a continuation-in-part of Ser. No. 766,902, Oct. 11, 1968, abandoned.

[52] U.S. Cl....... 331/94.5, 317/235 N, 317/235 AC

[51] Int. Cl............................................... H01s 3/18

[58] Field of Search.................... 331/94.5; 317/235; 250/217 SS

[56] References Cited

UNITED STATES PATENTS

| | | | |
|---|---|---|---|
| 3,604,991 | 9/1971 | Yonezu et al. | 331/94.5 |
| 3,456,209 | 7/1969 | Diemer | 331/94.5 |
| 3,501,679 | 3/1970 | Yonezu et al. | 317/234 |

OTHER PUBLICATIONS

Alferov, et al., Soviet Physics–Solid State, Vol. 9, No. 1, July 1967, pp. 208–210.

Alferov, Soviet Physics–Semiconductors, Vol. 1, No. 3, Sept. 1967, pp. 358–360.

Alferov, et al., Soviet Physics–Semiconductors, Vol. 2, No. 10, April 1969, pp. 1289–1291.

Kressel, et al., RCA Review, Vol. 30, March 1969, pp. 106–113.

*Primary Examiner*—William L. Sikes
*Assistant Examiner*—R. J. Webster
*Attorney*—R. J. Guenther and Arthur J. Torsiglieri

[57] ABSTRACT

A light emitting heterostructure diode includes a multi-layered structure having a common conductivity type heterojunction and a p-n junction separated therefrom by a distance less than the diffusion length of minority carriers, thereby defining an intermediate region bounded by said junctions.

In a single heterostructure (SH) diode there is one such heterojunction separating narrow and wide band gap regions of the same conductivity type and the p-n junction is a p-n homojunction formed in one instance by the diffusion of impurities into the narrow band gap region. When provided with an appropriate resonator, a confinement effect produced by an energy step (at the heterojunction) in the conduction band permits the SH diode to lase at higher temperatures and lower thresholds than heretofore possible, radiative electron-hole recombination occurring between the conduction and valence bands.

In a double heterostructure (DH) the diode is provided with a second heterojunction positioned on the side of the p-n junction remote from the other heterojunction, or positioned coincident with the p-n junction, thereby defining an intermediate region between a pair of heterojunctions. When provided with an appropriate resonator the DH diode exhibits lower thresholds at higher temperatures than even the aforementioned SH diode.

In both diodes additional improvement in the threshold occurs if the diode is provided with deep impurity levels of deep band tails.

Without a resonator, both the SH and DH diodes function as electroluminescent diodes with radiation being emitted from the intermediate region through the wide band gap region, thereby advantageously resulting in lower absorption losses and higher efficiency. Dome-like configurations of the wide band gap region of this diode are also disclosed.

9 Claims, 12 Drawing Figures

PATENTED SEP 11 1973

3,758,875

INVENTOR
I. HAYASHI
BY
Michael J. Urbano
ATTORNEY

DOUBLE HETEROSTRUCTURE JUNCTION LASERS

CROSS REFERENCES TO RELATED APPLICATIONS

This is a continuation-in-part of my copending application, Ser. No. 787,459 filed Dec. 27, 1968, now abandoned, which is in turn a continuation-in-part of my copending application, Ser. No. 766,902, filed Oct. 11, 1968, now abandoned.

BACKGROUND OF THE INVENTION

This invention relates to light emitting heterostructure diodes, including both semiconductor injection lasers and electroluminescent diodes.

In 1962, R. N. Hall et al. reported in *Physical Review Letters* 9, 366, their observation of coherent light emission produced by electron-hole recombination in GaAs pn-n junctions. Typically, GaAs lasers are fabricated by diffusing zinc into n-type GaAs wafers with donor concentrations in the order of $10^{18}$ / $cm^3$. For structural details, see *Masers and Lasers*, Thorp, J. S., Chapter 10, St. Martin's Press, New York (1967). Injection lasers have also been constructed from other semiconductors, e.g., InP, InAs and InSb. All such lasers, however, are fabricated from one kind of semiconductor material in which the band gaps are equal on either side of the junction. The one semiconductor is usually monocrystalline as taught by R. N. Hall in U. S. Pat. No. 3,245,002. In the semiconductor junction laser coherent radiation results from electron transitions between broad energy bands, i.e., between the conduction and valence bands. These junctions, and in particular GaAs junctions, are pumped mainly by the injection of electrons into the p-side of the junction by the direct application of an electrical current. The injection process produces a population inversion between a pair of electron energy levels when pumped at a sufficiently rapid rate and with sufficient power input. In semiconductor lasers this power threshold may be as high as $10^8$ to $10^9$ watts/$cm^3$ (or $10^5$ watts/$cm^2$) at room temperature, whereas by comparison in gas or crystal lasers the pumping power needed is usually in the range of 1 to 1,000 watts/$cm^3$. Obviously, the enormous power requirements of such semiconductor lasers at room temperature cannot be maintained very long without damaging the semiconductor.

It is known, however, that the power (or equivalently the current density) threshold in most prior art devices is approximately proportional to the cube of the absolute temperature in the temperature range near room temperature. Consequently, semicondcutor lasers generally are operated more easily in low temperature environments. For example, GaAs lasers have been operated at liquid nitrogen temperatures (77° K) with a threshold of about 1,000 amperes/$cm^2$. To date the highest temperature CW operation reported has been achieved by J. C. Dyment and L. A. D'Asaro et al at 200° K as reported in *Applied Physics Letters 11*, 292 (1967).

SUMMARY OF THE INVENTION

The invention is a light emitting heterostructure diode, a multilayered structure having a common conductivity type heterojunction and a p-n junction separated therefrom by a distance less than the diffusion length of minority carriers. In one embodiment, termed a single heterostructure (SH) diode, there is one such heterojunction separating narrow and wide band gap regions of the same conductivity type and the p-n junction is a p-n homojunction, thereby defining an intermediate region between the homojunction and heterojunction. In one instance, the p-n junction is formed by the diffusion of impurities into the narrow band gap region. In another embodiment, termed a double heterostructure (DH) diode, a second heterojunction is formed on the side of the p-n junction remote from the first heterojunction, thereby defining an intermediate region between the pair of heterojunctions. Alternatively, the second heterojunction may be coincident with the p-n junction, thereby forming a p-n heterojunction.

As used herein, a "heterojunction" is defined as the interface between continguous layers having different band gaps and is further defined as p-p, n-n or p-n (or n-p) depending on the majority carrier type on either side of the interface. The p-p and n-n types will hereinafter be referred to as "common conductivity type heterojunctions." Moreover, it is to be understood that a "p-n junction" includes either a p-n heterojunction or a p-n homojunction. In the homojunction the band gaps on either side of the junction are equal.

When provided with an appropriate optical resonator and when forward biased, both the SH and DH diodes exhibit lasing at lower thresholds and higher temperatures than heretofore possible, radiative recombination occurring between the conduction and valence bands. This result is believed to be due primarily to an electrical confinement effect produced by an energy step in the band structure which confines injected minority carriers to the intermediate region. To take advantage of this confinement it is essential that the thickness of the intermediate region (defined, as above, to be distance between the appropriate junctions) be less than the diffusion length of minority carriers. As the thickness of the SH is reduced confinement increases and the threshold decreases until a point where the onset of hole injection (out of the intermediate region) occurs. Thereafter the threshold begins to increase. Hole injection can be reduced by making the band gap of the region adjacent the p-n junction greater than that of the intermediate region. In the SH diode this may be accomplished by appropriate doping. In the DH diode, however, this is effectively accomplished by fabricating the diode as a three layered structure in which the intermediate narrow band gap layer (e.g., p-$al_yGa_{1-y}As$) is sandwiched between a pair of wider band layers (e.g., n-$A1_xGa_{1-x}As$, p-$al_zGa_{1-z}As$, where $y < x$ and $y < z$). Illustratively, $y = 0$ and the intermediate region consists, therefore, of p-GaAs. The DH, therefore, includes generally an n-n heterojunction, an n-p homojunction and a p-p heterojunction in which the first two junctions are separated by a distance $d_2$ less than the diffusion length of holes $D_H$ and the second two functions are separated by a distance $d_1$ less than the diffusion length of electrons. Moreover, the separation of the two heterojunctions (i.e., the thickness $t$ of the intermediate region) should be greater than about one-half wavelength of the radiation as measured in the intermediate region e.g., $\lambda = 0.25\mu$ in GaAs). That is, the following relationships should be satisfied:

$$d_1 < D_E \quad (1)$$

$$d_2 < D_H \quad (2)$$

$$\lambda/2 \leq t \quad (3)$$

It should be noted that the p-n junction may be coincident with either heterojunction. Where the n-n heterojunction and n-p homojunction are coincident to form an n-p heterojunction, then $\lambda/2 \leq t < D_E$. Similarly, where the p-p heterojunction and the n-p homojunction are coincident to form an n-p heterojunction, then $\lambda/2 \leq t < D_H$.

The conditions of equations (1) and (2), which limit the maximum thickness of the intermediate region, arise from the fact that for carrier confinement to exist the carriers must be able to reach the heterojunction, there to be repelled by the electric field produced by the energy step in the band structure. On the other hand, condition (3), which limits the minimum thickness of the intermediate region, is somewhat more complicated and is related to the amount of leakage optical field (i.e., field outside the intermediate region which acts as a waveguide) which can be tolerated. An excessive amount of such leakage increases optical absorption losses and decreases the coupling between radiation and recombination (i.e., decreases stimulated emission), both of which increase the lasing threshold. Calculations based upon the teachings of D. F. Nelson et al. in *Journal of Applied Physics*, 38, 4057 (1967) indicate that $\lambda/2$ sets an approximate lower limit. In GaAs and mixed crystals thereof $\lambda/2 \approx 0.125\mu$.

Additional reduction in the lasing threshold occurs if deep impurity levels or deep band tails near the valence band are provided in the intermediate region (on either or both sides of the p-n junction), in which case lasing is achieved by electron-hole recombination between the conduction band and the deep levels. Still further improvement in the temperature coefficient of threshold may be achieved by producing deep band tails near the conduction band in addition to the deep levels provided near the valence band. In an exemplary embodiment, the pair of semiconductive layers utilized are GaAs and a mixed crystal of p-$Al_xGa_{1-x}As$ in which the band gap in the mixed crystal is the greater.

Without an optical resonator, both the SH and DH diodes when forward biased function as electroluminescent diodes incoherent radiation being emitted from the intermediate region through the wide band gap region, thereby resulting in lower absorption losses and high efficiency. Dome-like configurations of the wide band gap region further increase efficiency by reducing reflection losses at the interface between the wide band gap region and the external atmosphere.

BRIEF DESCRIPTION OF THE DRAWINGS

The invention, together with its various features and advantages, can be easily understood from the following more detailed description taken in conjunction with the accompanying drawings, in which.

DETAILED DESCRIPTION

The immediately following description will be concerned primarily with the structure, theory and operation of heterostructure laser diodes in accordance with the invention. The discussion of an electroluminescent diode follows that description.

Single Heterostructure Diode

Figure 1:
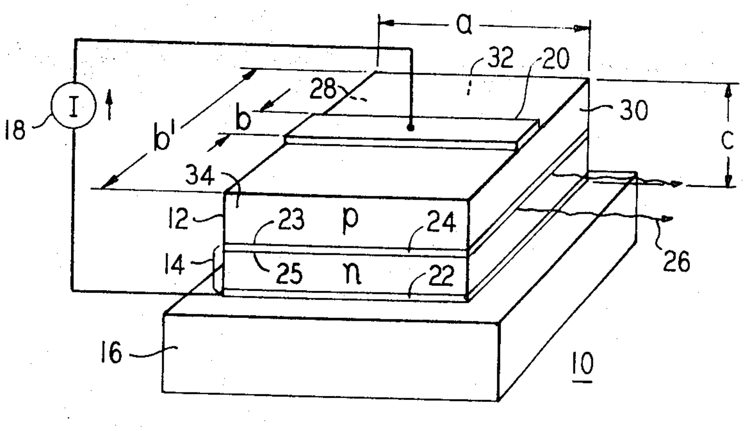
FIG. 1 is a schematic of one embodiment of a laser in accordance with the invention.

Turning now to FIG. 1, there is shown in accordance with an illustrative embodiment of the invention a semiconductor single heterostructure (SH) injection laser 10 comprising wide and narrow band gap layers 12 and 14, respectively, fabricated from different semiconductor materials disposed upon a heat-sink 16. A current source 18 is connected across the structure via electrodes 20 and 22 deposited, respectively, on the upper surface of the layer 12 and between heat-sink 16 and layer 14. An intermediate region 24 is defined as the region between p-p heterojunction 23 and p-n homojunction 25, the latter being located in the narrow band gap layer 14. When the device is foward biased and pumped by source 18, it emits coherent radiation 26 in the plane of the region 24 as shown. The two opposite surfaces 28 and 30 which are perpendicular to the plane of the intermediate region 24 are polished or cleaved flat and parallel by techniques well known in the art to within a few wavelengths of the coherent radiation to form a plane parallel optical resonator. The other pair of surfaces 32 and 34 perpendicular to the region 24 are often roughened. A reflective coating on the polished surfaces 28, 30, or a structure which has four polished sides, may be utilized in order to enhance the Q of the optical cavity.

As pointed out previously, one feature of the invention is that the injection laser has a unique diode structure which exhibits a confinement effect, the purpose of which will be hereinafter explained. The SH diode comprises a pair of contiguous semiconductive layers having different band gaps with a p-n junction located in the narrow band gap region and separated from a p-p heterojunction, located at the interface between the layers, by a distance $d_1$ less than the diffusion length D of minority (i.e., injected) carriers at the operating temperature of the device. Typically, the diffusion length is about 1$\mu$, but, depending on the doping levels and other parameters, could be larger.

The separated p-n junction and p-p heterojunction thus define three regions of interest: a narrow band gap region of one conductivity type, an intermediate region, and a wide band gap region of a second conductivity type. The intermediate region may have an effective band gap equal to, or slightly less than, that of the narrow band gap region, and generally is of the same conductivity type as the wide band gap region although it may be less heavily doped than the wide band gap region.

A distinction will be made hereinafter between the band gap and the effective band gap of a semiconductor. The band gap is defined as the energy difference between the minimum energy in the conduction band and the maximum energy in the valence band in an undoped semiconductor.

In the presence of a sufficiently high density of either donor or acceptor impurities, however, band tails exist on both the conduction and valence bands. Consequently, the energy distribution is an asymptotic function and therefore the aforementioned minimum and maximum are not clearly defined. An effective band gap will therefore be defined as follows. Find the energy level near (just below) the bottom of the conduction band such that just as many of the introduced donor states lie above as lie below that level. Find a smilar level near the top of the valence band. The difference between these two levels is termed the "effective band gap."

In the following discussion, it will be assumed for the purpose of illustration that the conductivity type of the narrow band gap, intermediate, and wide band gap regions is n-p-p, respectively. The effective band gap of each of these regions will be designated $E_{gn}$, $E_{gi}$ and $E_{gp}$, respectively.

Confinement Effect

Figure 2A:
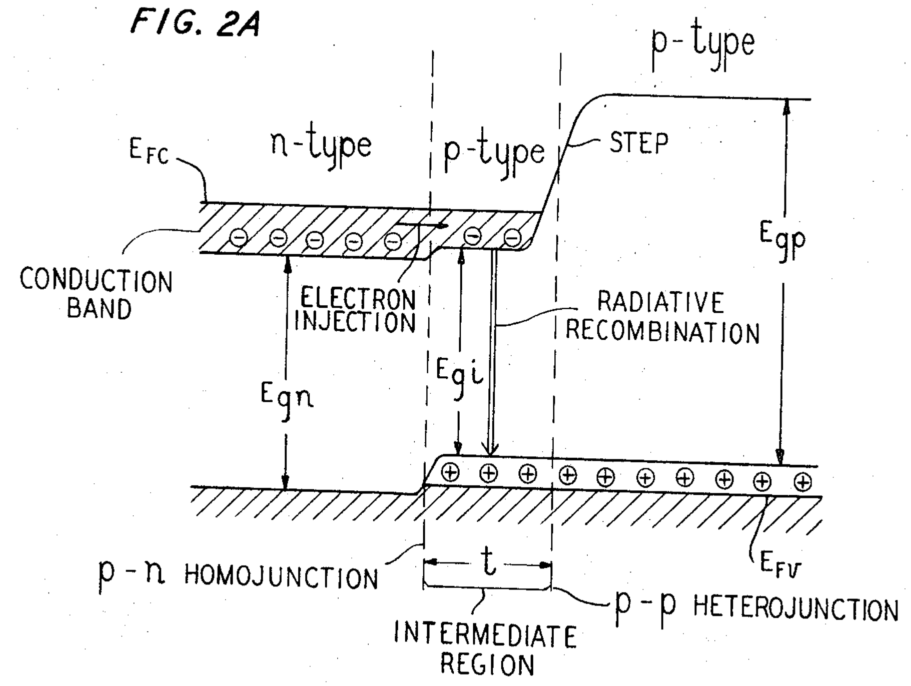
FIG. 2A is an energy level diagram for a laser under forward bias in accordance with an illustrative embodiment of the invention.
Figure 3A:
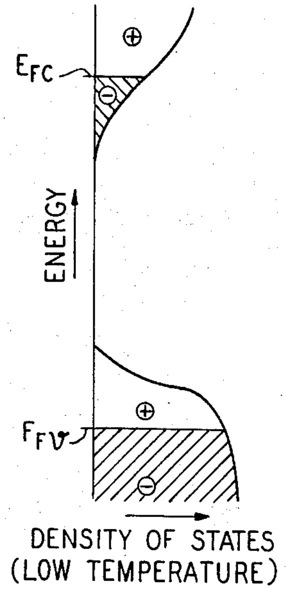
FIGS. 3A and 3B are energy level versus density of states diagrams at low and high temperatures, respectively, for conventional laser structures.
Figure 3B:
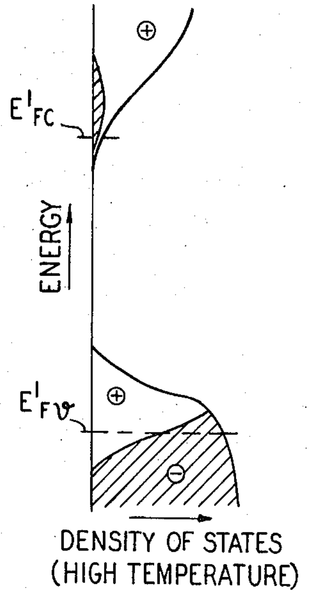

Under forward bias, as shown in FIG. 2A, electrons (in general minority carriers) in the conduction band are injected across the p-n homojunction into the intermediate region toward the p-p heterojunction. When a population inversion is established between the conduction and valence bands, and the lasing threshold is exceeded, stimulated radiative recombination occurs between electrons in the conduction band and holes in the valence band. In conventional diode structures the injected electrons cross the junction under forward bias and, there being no restraint such as a p-p heterojunction, diffuse deeper into the p-region, thereby decreasing the density of electrons which undergo recombination in the region where stimulated emission occurs and hence increasing the threshold. In the present invention, however, the electrons injected into the intermediate region are confined thereto by the energy step (FIG. 2A) created by the fact that $E_{gp} > {}_{Egi}$. This energy step prohibits electrons from crossing the p-p heterojunction and hence confines them to the intermediate region. Consequently, the density of electrons in the intermediate region is higher than would be otherwise attainable without confinement. This increased density of electrons reduces the lasing threshold as can readily be understood with reference to FIGS. 3A, 3B and 3C. FIGS. 3A and 3B depict the energy versus density of states of conventional structures at low and high temperatures, respectively, and FIG. 3C refers to a structure at high temperatures exhibiting a confinement effect in accordance with the invention. It is assumed, for the purpose of comparison, that the current density applied is the same in both the conventional structure of FIG. 3B and the invention of FIG. 3C.

Before discussing these figures in detail, one fundamental principle of semiconductor laser operation should be postulated; that is only those electrons which have energies close to the Fermi level in the conduction band ($E_{Fc}$) and only those holes which have energies close to the Fermi level in the valence band ($E_{Fv}$) can contribute to lasing, whereby "close to" it is meant that the carrier energies lie within about 1 to 2 kT of the Fermi level.

At low temperatures, as shown in FIG. 3A, electrons occupy 100 percent of the states in the conduction band up to $E_{Fc}$ and the holes occupy (or electrons are absent from) 100 percent of the states in the valence band above $E_{Fv}$. Theoretically, therefore, perfect population inversion exists between these two Fermi energies $E_{Fc}$ and $E_{Fv}$. At elevated temperatures, however, as shown in FIG. 3B, the minority carrier electrons are distributed up to higher energy levels due to thermal excitation. As a result, a major fraction of the electrons now exist at higher energies far from (i.e., more than about 1 to 2 kT) the new Fermi level $E_{Fc}$ in the conduction band. A similar change in distribution occurs in the valence band, but to a lesser extent. The combined effect of these two changes in distribution is that the fraction of electrons which can contribute to lasing decreases with increasing temperature which in turn implies higher thresholds at higher temperatures (i.e., reduced efficiency).

Figure 3C:
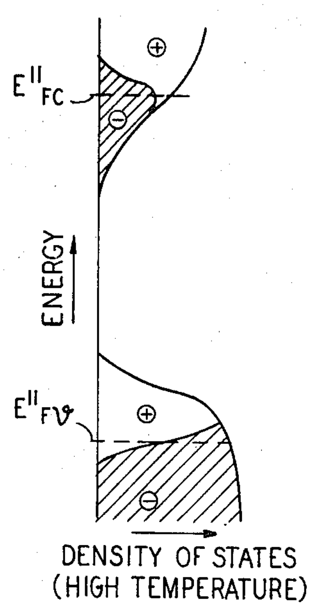
FIG. 3C is an energy level versus density of states diagram in the intermediate region, taken to be p-type, at high temperatures in a laser heterostructure exhibiting a confinement effect in accordance with one form of the invention.

In one aspect of the present invention, however, due to the aforementioned confinement effect, the density of electrons in the intermediate region is increased, as shown in the upper portion of FIG. 3C. Moreover, the new Fermi level $E''_{Fc}$ is at a higher energy level that that of conventional structures (i.e., higher than $E'_{Fc}$, FIG. 3B). Consequently, as shown in FIG. 3C, a greater portion of electrons is distributed "close to" Fermi level $E''_{Fc}$ and hence a greater portion of electrons can contribute to lasing, thereby reducing the threshold.

The n-p-p structure shown in FIG. 2A has one additional feature arising from the fact that the effective band gap $E_{gi}$ in the intermediate region is less than the effective band gap $E_{gn}$ in the n-side (that is, generally the effective band gap in the intermediate region is less than that in the narrow band gap region). Consequently, holes in the intermediate region are prevented from diffusing into the n-side which effectively contributes to reducing the lasing threshold.

A typical SH laser constructed in accordance with the foregoing principles of the invention has operated at about 9,000A when pumped at room temperature with a current density of less than 10,000 amp/cm$^2$. The structure comprised n-type, Sn doped GaAs having $4.2 \times 10^{18}$ electrons/cm$^3$. A wide band gap p-type $Al_xGa_{1-x}As$ region was formed using a liquid phase epitaxy tipping technique at 1,000° C (in which the mixed crystal is epitaxially gronw on a single crystal of GaAs) applied to 1 gm Ga, 3.84 mg A1, 200 mg GaAs and 10 mg Zn. The intermediate region was formed by Zn diffusion into the n-type GaAs. A detailed discussion of the tipping technique is the subject matter of United States copending application, Ser. No. 786,226 (M. B. Panish- S. Sumski Case 4-4) filed Dec. 23, 1968 and assigned to applicant's assignee, now U.S. Pat. No. 3,560,276 issued Feb. 2, 1971. Typical dimensions (in mils) are, with reference to FIG. 1, $a$=14, $b$=0.5, $b'$=4, $c$=6. The narrow band gap, intermediate and wide band gap regions had depths of, respectively, 5–6 mils, 1.5$\mu$ and 20$\mu$. To enhance the removal of heat from the device, the narrow band gap region (e.g., n-GaAs) can be considerably thinner (e.g., <0.2 mil). It has been found further that an intermediate region thickness (i.e., $t$) of about 2.0$\mu$ is preferred. A larger $t$ reduces the confinement effect and thereby increases the threshold. In a structure without the aforementioned difference in effective band gaps between the narrow band gap and intermediate regions, a much smaller $t$ results in the onset of hole injection and hence also increases the threshold.

It is possible, of course, to fabricate a diode in accordance with the invention by utilizing contiguous mixed crystal layers, e.g., a wide band gap $Al_xGa_{1-x}As$ layer and a narrow band gap $Al_yGa_{1-y}As$ layer in which $0 \le y < x$.

Double Heterostructure

As discussed with reference to the SH diode, but for the onset of hole injection which causes holes to be lost for radiative recombination purposes, it would be desirable to decrease further the thickness of the intermediate region. While the aforementioned difference in effective band gap between the narrow band gap and intermediate regions reduces such hole injection, it has been found that the double heterostructure diode increases significantly the confinement of both holes and electrons between the two heterojunctions, thereby resulting in lasing a lower threshold at room temperature than even the SH diode.

Figure 6A:
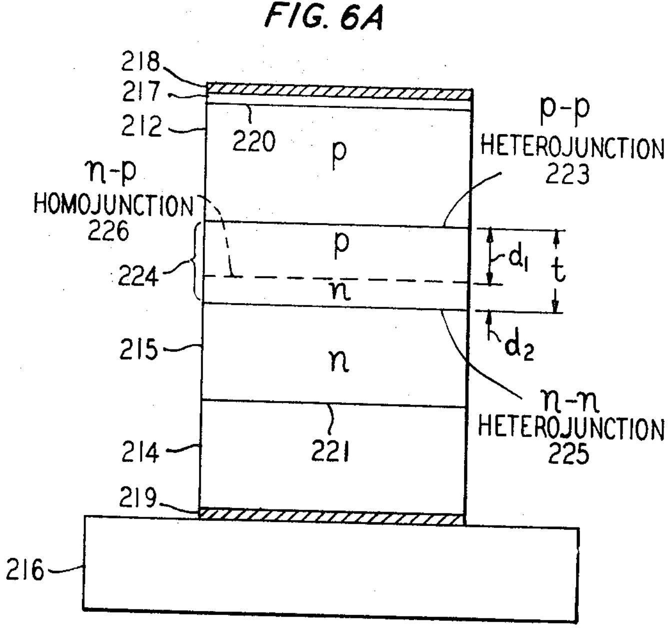
FIGS. 6A and 6B are schematics showing the relative positions of the homojunction and heterojunctions in accordance with two embodiments of the invention.

The DH diode, shown in FIG. 6A with the dimensions exaggerated for the purposes of illustration, comprises in one embodiment a heat-sink 216 on which is formed a multilayered structure including a metal contact 219, a substrate 214, a wide band gap n-type layer 215, a narrow band gap region 224, a wide band gap p-type layer 212, a contact layer 217 and a second contact 218. It should be noted that it is readily possible to fabricate the heat sink on contact 218, or on both contacts 218 and 219.

Figure 6B:
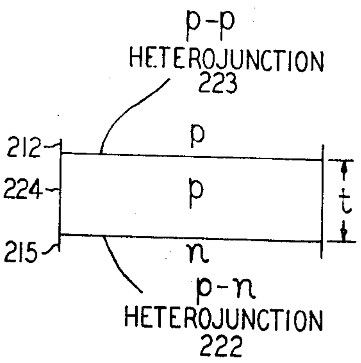

A p-p heterojunction 223 is located at interface between layer 212 and region 224 whereas an n-n heterojunction 225 is located at the interface between region 224 and layer 215. In addition, a p-n homojunction 226 is located between the heterojunction at a position such that equations (1) - (3) are satisfied. Alternatively, as shown in FIG. 6B, the p-n junction 226 may be coincident with n-n heterojunction 225 in which case they form a p-n heterojunction 222 (i.e., $d_2 = 0$, $d_1 = t$).

When a DH diode is provided with an appropriate optical resonator and forward biased, both by means well known in the art, electrons injected across the p-n homojunction 226 are reflected by p-p heterojunction 223 and undergo radiative recombination. And, whereas holes also undergo injection in the opposite direction across p-n homojunction 226, they are reflected by n-n heterojunction 225 and also undergo recombination. Thus, both injected holes and electrons are electrically confined to the intermediate region 224 resulting in lower thresholds at room temperature than heretofore possible, provided, of course, that the criteria defined by equations (1) – (3) are met. Preferably, $0.125\ \mu \le t < 1\ \mu$ (e.g., $t = 0.8\ \mu$) for a GaAs intermediate region. It should be noted that optical confinement produced by the two heterojunctions (which form a waveguide) also contributes somewhat to lower thresholds.

EXAMPLE

This example describes a double heterostructure laser diode in accordance with an illustrative embodiment of the invention fabricated by means of a liquid phase epitaxial technique described in copending application Ser. No. 28365 (M. B. Panish-S. Sumski Case 5-5) filed on Apr. 14, 1970 and assigned to applicant's assignee. Briefly, the apparatus utilized in the fabrication included a seed holder and a solution holder having a plurality of wells and adapted to be slid into position over the seed. The assembly was placed in a growth tube and inserted in a furnace (of the type not having a window port).

A silicon doped gallium arsenide wafer (about 0.25 inches × 0.5 inches × 20 mils) with about $4 \times 10^{18}$ electrons per cubic centimeter having faces perpendicular to the <100 > direction, obtained from commercial sources, was selected as a substrate member. The wafer was lapped with 305 carborundum, rinsed with deionized water, and etch-polished with a bromine-methanol solution to remove surface damage.

Four solutions were then prepared in the following manner. First, the following quantities of materials were weighed out. For solution, I, 1 gm Ga, 100 mg GaAs (undoped), 2 mg Al and 15 mg Sn. For solution II, 1 gm Ga, 100 mg GaAs (undoped) and 1 mg Si. For solution III, 1 gm Ga, 50 mg GaAs (undoped), 3 mg Al and 5 mg Zn. For solution IV, 1 mg Ga, 75 mg GaAs (undoped) and 32 mg Ge. For each solution the Ga plus GaAs was briefly preheated to 900° C under $H_2$ in a graphite solution holder. The seed and the four prepared solutions of Ga plug GaAs were placed in separate wells in the solution holder. The remainder of the solid components which had been weighed out were then placed into the proper wells with the premixed Ga plug GaAs and were mechanically forced under the surface of the liquid Ga to insure good contact upon subsequent heating. The holder assembly was then placed into a fused silica growth tube. Hydrogen was passed through the tube to flush out air. After flushing for about 10 minutes the tube containing the holders was placed into the furnace which was at 870° C. An auxiliary heater, which consisted of a single loop of about 2 feet of 20 mil nichrome wire heated by 20 volts a.c. was disposed under the seed and was on during this operation. The temperature as measured by a thermocouple, also disposed under the seed, was allowed to rise to about 870° C and then a cooling rate of 3°C/minute was established. At 850° C the solution holder was moved so that solution I came into contact with the seed. A mechanical vibrator was used to agitate the solution slightly while cooling to 830° C occurred. At 830° C the solution holder was moved so that solution II covered the seed and remained there with vibration for about 15 seconds. The solution holder was then again moved so that the seed was disposed under the solution III, where it was held for 30 seconds (with vibration). The solution holder was then again moved so that the seed was placed under solution IV and kept there for 60 seconds (with vibration), following which the seed holder was moved again so that a close fitting upper graphite surface of the solution holder wiped the residual of solution IV from the seed. During this entire procedure the cooling rate of 3° C/minute was maintained. Following the last step the tube was removed from the furnace and allowed to cool to room temperature. This procedure resulted in a wafer 214 of n-type GaAs upon which were deposited, epitaxially, four layers as shown in FIGS. 6A and 6B. The first layer 215 on the substrate 214 is estimated to consist of n-$Ga_{1-x}Al_xAs$ with $x$ approximately 0.3–0.5, doped by Sn to about $10^{18}$ electrons/cm$^3$. An n-n heterojunction 221 was formed at the interface between layers 214 and 215. The second layer 224 was GaAs doped by Si (and possibly Zn from diffusion from the following layer) compensated, but p-type. A p-n heterojunction 222 was formed at the interface between layers 215 and 224. The third layer 212 was estimated to be p-Ga $_{1-x}Al_xAs$ with $x$ approximately in the range 0.3–0.5 doped p-type by Zn in the range of $10^{18}$–$10^{19}$ holes/cm$^3$. A p-p heterojunction 223 was located at the interface between layers 212 and 224. The fourth layer 217 was GaAs doped p-type by Ge to about $10^{18}$ holes/cm3. This resulted in another p-p heterojunction 220 between layers 212 and 217.

The thicknesses of the layers 215, 224, 212 and 217 in a section measured were approximately 5 μm, 1.5 μm, 1.9 μm and 2–15 μm, respectively. The separation of the p-n heterojunction 222 from the p-p heterojunction 223 was therefore approximately 1.5 μm.

A non-heat sinked laser diode was then prepared from the wafer so obtained for the purpose of evaulating the threshold current density. This end was achieved by initially skin diffusing Zn at high concentration ($10^{20}$Zn/cm$^3$) to a depth of 0.2 μm into the surface of the wafer. The substrate was then lapped to a thickness of about 6 mils. Contact (FIG. 6A; layers 218 and 219) to the n and p surfaces of the wafer was made by conventional evaporation techniques whereby layers of chromium and then golf of several thousand angstroms thickness were applied. The resultant structure was then cut and cleaved to form a number of diodes which were mounted on holders adapted with means for contacting both the n and p sides of the structures.

The resultant laser diodes were mounted in a microscope fitted for observation of infrared light and were actuated by a pulses power supply. At room temperature the threshold current density of a laser diode made from this wafer was 3,900 A/cm$^2$.

Utilizing similar techniques, other diodes with the intermediate region 224 less than 1.0 μm thick exhibited room temperature thresholds as low as 3,000 A/cm$^2$. Moreover, fully internally reflecting diodes exhibited room temperature thresholds in the range 2,300–2,800 A/cm$^2$.

Deep States Structure

Figure 2B:
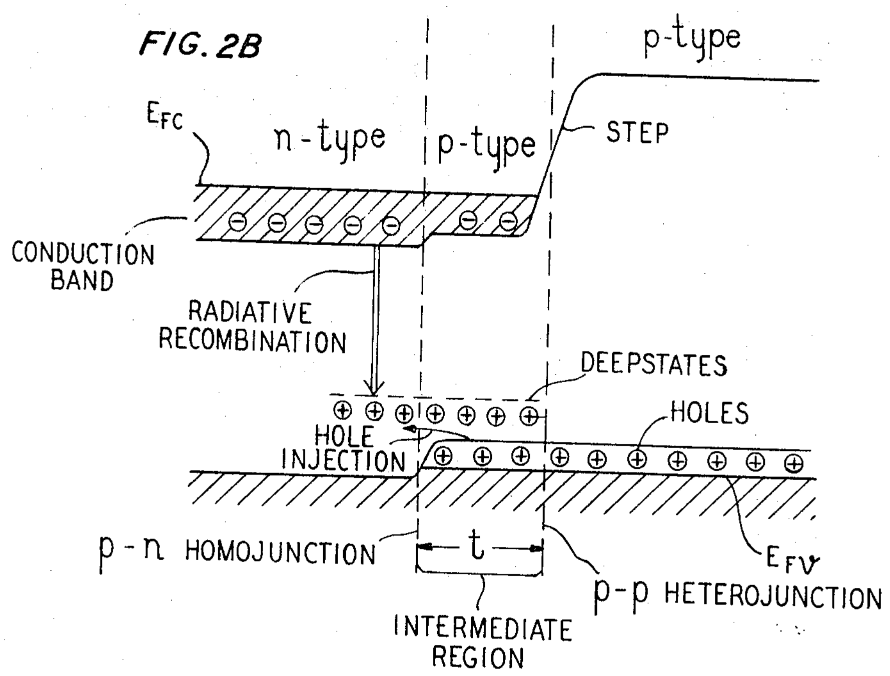
FIG. 2B is an energy level diagram for a laser under forward bias and having deep states in accordance with another embodiment of the invention.

In addition to the confinement effect, deep states, either deep isolated impurity states or deep band tail states, near the valence band may be provided in he narrow band gap region, as shown in the SH diode of FIG. 2B, which for the purposes of illustration is again taken to be an n-p-p type structure (n-p-p corresponding to the conductivity type of the narrow band gap — intermediate — wide band gap regions, respectively). Thus in FIG. 2B, the deep states are provided in at least the narrow band gap n-type region. In this case the current source 18 (FIG. 1) produces a population inversion between electrons in the conduction band and holes in the deep states, and consequent radiative recombination of the holes and electrons produces coherent radiation as shown by the double arrow in the n-type narrow band gap region. It is also possible, however, for the radiative recombination to occur in the intermediate region. In the deep states structure, the p-p heterojunction serves primarily to control the type of minority carrier injection which is dominant. In the n-p-p structure, hole injection from the valence band into the deep states on the n-side is dominant. In such a device, it may be desirable that $d$ be very small, e.g., $d$ much smaller than the diffusion length of minority carriers. Illustratively, the radiation at room temperature is in the near infrared at about 1.30 ev (9,500A) for an injection laser in which the pair of contiguous semiconductor layers utilized are GaAs and a mixed crystal of p-$Al_xGa_{1-x}As$ in which deep impurity states are created by Mn doping and the band gap in the mixed crystal is the greater.

Another feature of one embodiment of the invention is the additional reduction of the temperature coefficient of threshold by the provision of deep band tail states near the conduction band. This technique will be explained more fully hereinafter. The use of deep states and/or deep band tails, of course, applies equally as well to DH laser diodes.

The following materials and parameters are illustrative only and are not to be construed as limitation upon the scope of the invention. A single heterostructure semiconductor injection laser, as shown in FIG. 1, may be constructed utilizing: a narrow band gap layer 14 (n-type except for the intermediate region 24) comprising GaAs grown from a Ga solution containing 1 to 10 mg Mn and 0.1 to 2 mg Te per lg Ga; a p-type wide band gap layer 12 comprising p-$Al_xGa_{1-x}As$ ($x = 0.1$ to 0.5), i.e., a mixed crystal of AlAs and GaAs grown from a Ga solution containing 1 to 10 mg Zn, 1 to 10 mg Mn and 1 to 10 mg Al per 1g Ga and electrodes 20 and 22 comprising, respectively, Ti and Au and Sn and Ni. Typical dimensions are (in mils) $a$=15, $b'$=4, $b$=0.5 and $c$=6. The depth of the wide and narrow band gap regions, respectively, is typically 20 μ and 0.5 mil, whereas the thickness of the intermediate region, as previously mentioned, is preferably much less than the diffusion length of minority carriers.

Theory of Deep States

The following discussion is directed toward several problems associated with a GaAs laser, but the problems and solutions set forth apply equally as well to semiconductor lasers using other materials such as InP, InAs and InSb.

As pointed out previously, one of the serious problems with conventional GaAs injection lasers is the fact that the threshold current density for lasing increases very rapidly with temperature, near room temperature, i.e., it is approximately proportional to $T^3$ so that the threshold at room temperature is about fifty to one hundred times greater than that at liquid nitrogen temperature (77°K). Consequently, the GaAs injection laser, which lases easily at liquid nitrogen temperatures, requires large current densities (e.g., 30,000 amp/cm³) at room temperature where only pulsed operation, and not CW operation, has been possible.

The primary cause of this exponential temperature dependence of the threshold is the change in carrier distribution with temperature in the conduction and valence bands as was previously explained with reference to FIGS. 3A and 3B. The high threshold at high temperatures can be alleviated by, in addition to the use of the confinement effect, modification of the band shape in accordance with the teachings of the invention as was briefly mentioned in the previous section and as will be described herein with reference to FIGS. 4A, 4B and 4C which show energy versus density of states at an elevated temperature.

Figure 4A:
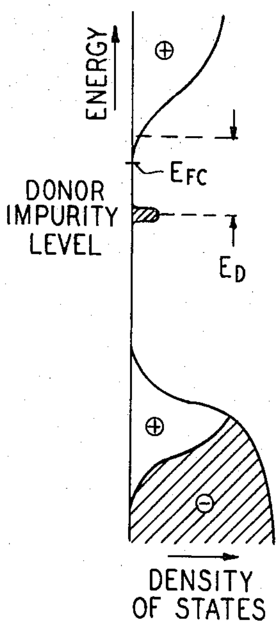
FIG. 4A is a high temperature energy level versus density of states diagram showing the relative location of deep impurity states near the conduction band in accordance with one form of the invention.

One deep state technique would be to provide deep isolated impurity (donor) states near the conduction band in a conventional semiconductor (e.g., GaAs) laser which relies primarily on electron injection. By "deep" it is meant that the energy separation $E_D$ between the bottom of the conduction band and the impurity states (as shown in FIG. 4A) is at least several times kT (e.g., 2 to 6 kT), where $k$ is Boltzmann's constant and T is the absolute temperature of the device. If this condition is satisfied, then electrons in the impurity level will not be pumped by thermal excitation into the conduction band. Thus, population inversion between carriers in the impurity level and the valence band would be maintained at higher temperatures. One problem remains, however. The energy $E_D$, to a first approximation, is proportional in the hydrogen model to $m_e/\epsilon^2$, where $m_e$ is the effective electron mass and $\epsilon$ is the dielectric constant. In GaAs, and other similar semiconductors such as InP, InAs and InSb, $m_e$ is too small to produce a discrete isolated donor level distinguishable from the conduction band (i.e., $E_D$ is typically only 3 or 4 mev in GaAs, whereas $kT = 26$ mev at room temperature). Consequently it is difficult to get an impurity element which produces the deep donor states required to maintain population inversion at higher temperatures.

Figure 4B:
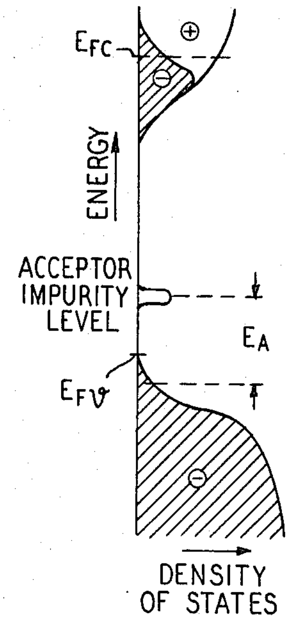
FIG. 4B is a high temperature energy level versus density of states diagram showing the relative location of deep acceptor states near the valence band in accordance with one form of the invention.

On the other hand, the effective hole mass $m_h$ is much greater than $m_e$ (e.g., $m_h \approx 10\, m_e$ in GaAs). Consequently according to the hydrogen model, acceptor levels, as shown in FIG. 4B, would be much deeper (e.g., $E_A$ is 30 to 40 mev above the valence band in GaAs) than the donor levels. In addition, several elements such as Mn, Co, Ni, Cu or Au produce acceptor levels deeper than 100 mev above the valence band in GaAs. However, to utilize such an acceptor level to obtain more stable population inversions at higher temperatures, it is desirable that certain criteria be satisfied in the region where radiative recombination occurs. Namely, (1) the density of electrons in the conduction band should be high enough to be relatively insensitive to changes in distribution produced by thermal excitation, and (2) holes should completely occupy the deep acceptor states but few holes should occupy states in the valence band, and the density of the holes in the acceptor states should be such as to produce upon recombination sufficient intensity for lasing.

These criteria are satisfied in a single heterostructure semiconductor injection laser, as previously described, comprising a pair of contiguous semiconductive layers having different band gaps, a p-n homojunction in the narrow band gap material separated from a p-p heterojunction located at the interface between the layers, by a distance less than the diffusion length of minority carriers, thereby defining, as before, an intermediate region between the p-n junction and the p-p heterojunction. In addition, deep "isolated" acceptor states are provided in the intermediate and/or narrow band gap region by appropriate doping. This structure creates an energy step (FIGS. 2A and 2B) in the conduction band which prevents electron diffusion beyond the heterojunction into the wide band gap side. As a result of this confinement effect, as discussed previously, the electron density in the intermediate region is maintained higher under forward bias than is otherwise attainable in conventional structures without the confinement effect. Thus, condition (1) is satisfied. Under a suitable forward bias, proper acceptor impurity doping satisfies condition (2).

Figure 4C:
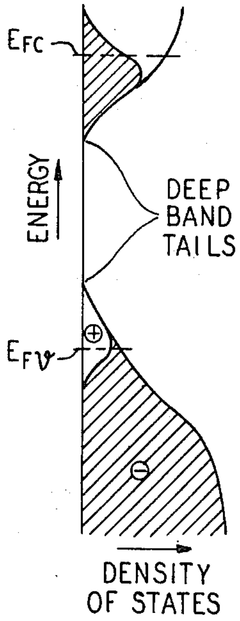
FIG. 4C is a high temperature energy level versus density of states diagram showing the relative location of deep band tail states in accordance with the one form of the invention.

Alternatively, as shown in FIG. 4C, deep states may be provided by heavy doping (e.g., $10^{19}$/cm³) which creates in the intermediate and/or narrow band gap region deep band tail states, instead of deep isolated impurity states, which extend from the valence band and/or the conduction band into the forbidden gap. These band tails, as with the deep impurity states, maintain relatively constant carrier distribution despite thermal excitation provided they are more than several $kT$ from the band edge. Typical dopants which will produce both conduction and valence band tails include Si, Ge and Sn. On the other hand, Te alone will produce conduction band tails, whereas Zn alone produces valence band tails.

It is readily possible to realize a high Q cavity in both embodiments of the invention, that employing solely the confinement effect and that including deep states, as compared to conventional laser diodes. The use of contiguous narrow and wide band gap layers, which have therefore different indices of refraction, creates an interface at the heterojunction which tends to prevent loss of radiation into the wide band gap layer. In addition, the use of the wider band gap layer reduces the absorption of stimulated radiation because the radiation occurs in the narrower band gap or intermediate region. Thus, the energy associated with the radiation is less than the band gap on the wide band gap side and therefore cannot very effectively be absorbed. It may be especially desirable to utilize such a high Q cavity in the embodiment of the invention employing deep states inasmuch as the density of states which contribute to lasing is somewhat smaller than in the basic structure employing only the confinement effect. To obtain a high Q cavity reflection loss at the cavity mirrors should be reduced. A high reflective coating on the mirror surfaces or a totally reflecting mode in a four-sided mirror cavity can be utilized for this purpose. Such a high Q structure reduces the threshold current density and thus reduces the input power, one of the factors limiting the temperature of operation.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, as mentioned previously, the foregoing deep states-deep band tails discussion applies equally as well to DH diodes, especially the embodiment of FIG. 6A in which the p-n junction is a p-n homojunction. Moreover, in order to limit the number of oscillating modes in the device, it may be desirable in some instances to employ a stripe geometry as taught by R. A. Furnanage and R. K. Wilson in U.S. Pat. No. 3,363,195 filed July 1, 1963 and issued Jan. 9, 1968.

Electroluminescent Diode

Figure 5:
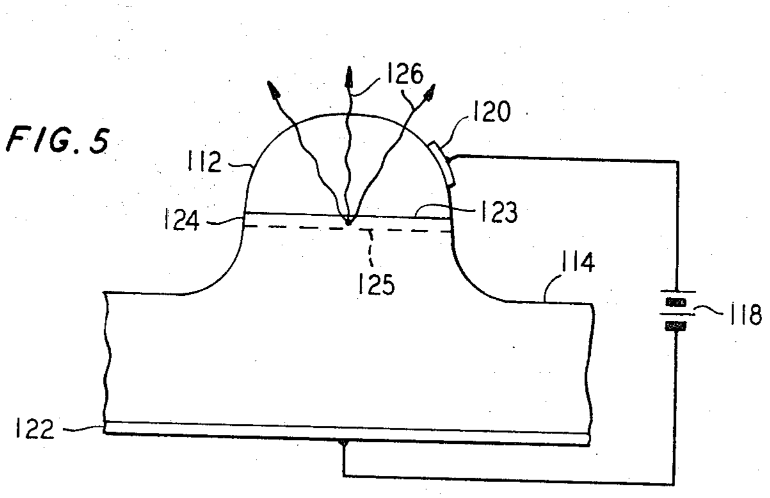
FIG. 5 is a schematic of an electroluminescent diode in accordance with another embodiment of the invention.

The previously described SH and DH laser diode also functions efficiently as an electroluminescent diode, with the omission of the optical resonator. The description which follows, however, will be limited to an SH electroluminescent diode with the understanding that similar considerations apply to the DH. With reference to FIG. 5, the basic single heterostructure, as before, comprises contiguous semiconductor layers 112 and 114 of different band gaps with a p-n homojunction 125 located in the narrow band gap layer 114 and separated from a p-p heterojunction 123 located at the interface between the layers. A current source 118, connected across contacts 120 and 122, respectively, deposited on the side of layer 112 and the bottom of layer 114, produces radiation 126 in the intermediate region which propagates out of the device through the wide band gap layer 112. In the embodiment shown, the narrower band gap layer 114 forms a substrate having a mesa-like configuration to reduce current spreading effects therein. Moreover, the wider band gap layer 112 is formed in the shape of a dome or hemisphere, thereby to reduce reflection losses at the interface between layer 112 and the external atmosphere by increasing the portion of the radiation 126 which undergoes normal incidence at that interface. Both the mesa and dome structures improve the efficiency of the device. Efficiency is increased further since radiation generated in the intermediate region has an energy lower than the bang gap of layer 112, thereby reducing absorption losses, i.e., in a conventional GaAs electroluminescent diode, the band gap of the p-region is nearly equal to the radiation energy and consequently causes higher loss due to optical absorption.

In a diode structure as shown in FIG. 5 (except that layer 112 is planar, not dome-like) spontaneous emission at about 8,800 A and about 1 percent efficiency has been observed. The diode substrate 114 comprised n-GaAs doped with Sn or Si to a concentration of about $2 \times 10^{18} - 4 \times 10^{18}/cm^3$ and a layer 112 of p-$Ga_xAl_{1-x}As$ ($x \approx 0.3$–$0.5$) and was driven by about 10 ma of direct current. While the thickness of the intermediate p-GaAs region 124 (about 1–4 $\mu$) should not cause appreciable absorption losses, precise control thereof is not as important as in the laser diode. The diameter of the top of the mesa is typically about 500 $\mu$whereas the bottom of the mesa is about 50 mils and is not critical. However, smaller diameters at the top increase efficiency by increasing the current density.

What is claimed is:

1. In a double heterostructure junction laser, a semiconductor active medium comprising

- a common conductivity type first heterojunction,
- a p-n junction separated therefrom by a distance $d_1$ which is less than the diffusion length of minority carriers injected toward said first heterojunction when said p-n junction is forward biased,
- a second heterojunction disposed on the side of said p-n junction remote from said first heterojunction and separated from said p-n junction by a distance $d_2 \geq 0$ which is less than the diffusion length of minority carriers injected toward said second heterojunction when said p-n junction is forward biased, thereby defining an intermediate region between said heterojunctions, the thickness $t$ of said intermediate region being less than approximately 1.0 $\mu$ and greater than approximately $\lambda/2$ so that said laser is capable of continuous wave operation at temperatures at least as high as room temperature, where $\lambda$ is the wavelength of coherent radiation generated in said intermediate region when said p-n junction is forward biased.

2. A double heterostructure laser device having a current threshold for lasing and capable of continouus wave operation at temperatures at least as high as room temperature, comprising

- at least two reflecting surfaces forming an optical cavity resonator for sustaining coherent radiation,
- means for extracting a portion of the radiation from said resonator,
- an active medium according to claim 1 disposed between said surfaces and on the optic axis of said resonator,
- means for causing the injection of minority carriers across said p-n junction and toward said heterojunctions, thereby to produce radiative recombination of holes and electrons,
- said injection means comprising means for forward biasing said p-n junction and for applying direct current thereto in magnitude sufficient to produce optical radiation,
- and wherein said applied current exceeds said threshold for lasing.

3. The device of claim 1 wherein $0 < d_2$, said second heterojunction is a common conductivity type heterojunction and said p-n junction is a p-n homojunction.

4. The device of claim 1 wherein $d_2 = 0$ and said second heterojunction and said p-n junction coincide to form a p-n heterojunction.

5. The device of claim 4 wherein said heterojunctions define a three-layered structure comprising a first layer of n-$Al_xGa_{1-x}As$, said intermediate region of p-$Al_yGa_{1-y}As$ and a second layer of p-$Al_zGa_{1-z}As$, where $0 \leq y < x$ and $z$.

6. The device of claim 44 wherein the thickness $t$ of said intermediate region is in the range of approximately 0.125–1.0$\mu$.

7. The device of claim 44 in combination with a layer of p-GaAs formed on said second layer, thereby to permit the making of good electrical contact to said second layer and said diode.

8. For use in a double heterostructure injection laser, an active medium comprising

- a substrate comprising n-GaAs,
- a first wide band gap layer comprising n-$Al_xGa_{1-x}As$, $x > 0$, contiguous with said substrate,
- an intermediate layer comprising p-GaAs contiguous with said first layer, thereby forming a p-n heterojunction at the interface between said layers,
- a second wide band gap layer comprising p-$Al_zGa_{1-z}As$, $z > 0$, contiguous with said intermediate layer, thereby forming a p-p heterojunction at the interface between said intermediate and second layers, the separation of said heterojunctions being within the range of approximately 0.125$\mu$–1.0$\mu$, so that said laser is capable of continouus wave operation at temperatures at least as high as room temperature,
- a layer of p-GaAs contiguous with said second layer to permit the making of electrical contact thereto, a pair of oppositely facing reflecting surfaces formed transverse to said intermediate layer, thereby forming an optical cavity resonator for sustaining coherent radiation, means for extracting a portion of the radiation from said resonator, and at least one heat sink thermally coupled to said laser for extracting heat therefrom.

9. The medium of claim 8 in combination with means for causing the injection of electrons across said p-n heterojunction, thereby to produce radiative recombination in said intermediate layer, said injection means comprising means for forward biasing said p-n heterojunction and for applying direct current thereto in magnitude sufficient to produce coherent radiation.

* * * * *

UNITED STATES PATENT OFFICE
CERTIFICATE OF CORRECTION

Patent No. 3,758,875 Dated September 11, 1973

Inventor(s) Izuo Hayashi

It is certified that error appears in the above-identified patent and that said Letters Patent are hereby corrected as shown below:

Column 1, line 19, change "pn-n" to --p-n--.

Column 2, line 49, change "p-$al_y$" to --p-$Al_y$--.

Column 2, line 51, change "p-$al_z$" to --p-$Al_z$--.

Column 2, line 63, after "region" and before "e.g." insert -- ( --.

Column 3, line 49, before "in" insert --or p-$GaAs_{1-x}P_x$--.

Column 5, line 38, change "smilar" to --similar--.

Column 5, line 66, after " > " and before "This" change "Egi" to --$E_{gi}$--.

Column 7, line 2, change "gronw" to --grown--.

Column 8, line 37, after "solution" delete the comma.

Column 8, line 41, after "solution IV" change "1 mg Ga" to --1 gm Ga--.

Column 8, line 46, change "plug" to --plus--.

Column 8, line 49, change "plug" to --plus--.

Column 9, line 25, at the beginning of the line, change "1_x$Al_x$As" to --$_{1-x}Al_xAs$--.

Column 9, line 29, after "about" change "$_{10}{}^{18}$ holes/$cm^3$" to --$10^{18}$ holes/$cm^3$--.

UNITED STATES PATENT OFFICE
CERTIFICATE OF CORRECTION

Patent No. 3,758,875 Dated September 11, 1973

Inventor(s) Izuo Hayashi

It is certified that error appears in the above-identified patent and that said Letters Patent are hereby corrected as shown below:

Column 9, line 46, change "golf" to --gold--.

Column 9, line 66, at the end of the line change "he" to --the--.

Column 12, line 30, after --tails.-- insert the following: --In addition, mixed crystals such as $In_xGa_{1-x}As$ are particularly amenable to the existence of deep band tails, i.e., a diode structure in which the pair of semiconductor materials are a mixed crystal of $In_xGa_{1-x}As$ and p-GaAs in which the mixed crystal has the narrower band gap. Alternatively, the mixed crystal $GaAs_{1-x}Sb_x$ could be substituted for $In_xGa_{1-x}As$.--.

Column 13, line 52, after "μ" insert a comma.

Column 14, line 12, change "continouus" to --continuous--.

Column 14, line 43, change "44" to --5--.

Column 14, line 46, change "44" to --5--.

Column 14, line 65, change "continouus" to --continuous--.

Signed and sealed this 21st day of May 1974.

(SEAL)
Attest:

EDWARD M.FLETCHER,JR.
Attesting Officer

C. MARSHALL DANN
Commissioner of Patents